(12) United States Patent
Lai et al.

(10) Patent No.: US 11,690,198 B2
(45) Date of Patent: Jun. 27, 2023

(54) ELECTRONIC DEVICE

(71) Applicant: ASUSTEK COMPUTER INC., Taipei (TW)

(72) Inventors: Yi-Chi Lai, Taipei (TW); Ing-Jer Chiou, Taipei (TW); Sung-Chuan Huang, Taipei (TW)

(73) Assignee: ASUSTEK COMPUTER INC., Taipei (TW)

(*) Notice: Subject to any disclaimer, the term of this patent is extended or adjusted under 35 U.S.C. 154(b) by 0 days.

(21) Appl. No.: 17/677,491

(22) Filed: Feb. 22, 2022

(65) Prior Publication Data
US 2022/0330455 A1  Oct. 13, 2022

(30) Foreign Application Priority Data

Apr. 9, 2021 (TW) ................................. 110203833

(51) Int. Cl.
*H05K 7/20* (2006.01)
(52) U.S. Cl.
CPC ............................. *H05K 7/20209* (2013.01)
(58) Field of Classification Search
CPC ...... G06F 1/203; G06F 1/1616; G06F 1/1681; G06F 1/206; G06F 2200/202; G06F 1/1618; G06F 1/1677; G06F 1/20; G06F 2200/201; G06F 1/1613; G06F 1/1641; H05K 7/20136; H05K 7/20209; H05K 5/0213; H05K 7/20145; H05K 7/20172; H05K 5/0226; H05K 7/16; H05K 7/20163; H05K 7/20181; E05D 1/06; E05D 11/0054; E05D 15/502
See application file for complete search history.

(56) References Cited

U.S. PATENT DOCUMENTS

| | | | | |
|---|---|---|---|---|
| 4,980,848 | A * | 12/1990 | Griffin | G06F 1/203 |
| | | | | 361/679.09 |
| 5,313,362 | A * | 5/1994 | Hatada | G06F 1/203 |
| | | | | 361/736 |
| 6,496,369 | B2 * | 12/2002 | Nakamura | G06F 1/1656 |
| | | | | 312/236 |
| 7,871,319 | B2 * | 1/2011 | Tracy | G06F 1/203 |
| | | | | 454/195 |
| 9,213,374 | B2 | 12/2015 | Hung et al. | |
| 10,317,950 | B2 * | 6/2019 | Chiang | F16C 11/04 |
| 10,356,942 | B2 * | 7/2019 | Degner | G06F 1/203 |

(Continued)

FOREIGN PATENT DOCUMENTS

| | | |
|---|---|---|
| CN | 101727127 B | 10/2011 |
| CN | 104597966 B | 12/2017 |

*Primary Examiner* — Michael A Matey
(74) *Attorney, Agent, or Firm* — Muncy, Geissler, Olds & Lowe, P.C.

(57) ABSTRACT

An electronic device is provided. The electronic device includes a first body, a second body, and a baffle structure. The first body includes a first edge. The second body includes a second edge. The first edge is pivotally connected to the second edge, and an air outlet is provided on the second edge. An air duct is formed between the first edge and the second edge. The baffle structure is disposed in the air duct and located at a position corresponding to the air outlet. The baffle structure selectively closes the air duct according to a temperature of the air outlet, to avoid a rising temperature inside the electronic device due to hot air backflow.

7 Claims, 4 Drawing Sheets

(56) References Cited

U.S. PATENT DOCUMENTS

| | | | | |
|---|---|---|---|---|
| 10,732,678 | B2* | 8/2020 | Shaw | E05D 1/04 |
| 10,921,861 | B2* | 2/2021 | Mii | G06F 1/1656 |
| 11,262,820 | B1* | 3/2022 | North | G06F 1/3296 |
| 11,314,297 | B1* | 4/2022 | Degner | G06F 1/1618 |
| 2004/0114322 | A1* | 6/2004 | Agata | G06F 1/203 361/679.27 |
| 2008/0089023 | A1* | 4/2008 | Kumhyr | G06F 1/203 361/679.48 |
| 2010/0167636 | A1* | 7/2010 | Bhattacharya | H05K 5/0213 454/239 |
| 2013/0077241 | A1* | 3/2013 | Senatori | G06F 1/203 361/694 |
| 2013/0163201 | A1* | 6/2013 | Wang | H05K 5/0213 361/692 |
| 2014/0092542 | A1* | 4/2014 | Nishi | G06F 1/203 361/679.21 |
| 2014/0133095 | A1* | 5/2014 | Wu | G06F 1/1616 361/692 |
| 2018/0188782 | A1* | 7/2018 | Lin | G06F 1/20 |
| 2020/0142456 | A1* | 5/2020 | Hsu | G06F 1/203 |
| 2021/0173456 | A1* | 6/2021 | Kulkarni | H05K 7/20172 |
| 2021/0356999 | A1* | 11/2021 | Chao | G06F 1/1616 |
| 2022/0171439 | A1* | 6/2022 | Lin | G06F 1/1681 |
| 2022/0382345 | A1* | 12/2022 | Chen | G06F 1/206 |

\* cited by examiner

ELECTRONIC DEVICE

CROSS-REFERENCE TO RELATED APPLICATION

This application claims the priority benefit of Taiwan application serial No. 110203833, filed on Apr. 9, 2021. The entirety of the above-mentioned patent application is hereby incorporated by reference herein and made a part of the specification.

BACKGROUND OF THE INVENTION

Field of the Invention

The disclosure relates to an electronic device, and in particular, to a foldable electronic device.

Description of the Related Art

Air outlets on a main base of a conventional notebook computer are covered by a screen. Consequently, a part of hot air is sucked by a heat dissipation fan and flows back into the main base. In this case, a surface temperature of the main base rises, affecting operating comfort of a user. In addition, a system temperature inside the main base also rises, affecting the performance of system operation.

BRIEF SUMMARY OF THE INVENTION

The disclosure provides an electronic device. The electronic device includes a first body, a second body, and a baffle structure. The first body includes a first edge. The second body includes a second edge. The first edge is pivotally connected to the second edge, and an air outlet is provided on the second edge. An air duct is formed between the first edge and the second edge. The baffle structure is disposed in the air duct and located at a position corresponding to the air outlet. The baffle structure selectively closes the air duct according to a temperature of the air outlet.

In the electronic device provided in the disclosure, a baffle structure selectively closes an air duct disposed between a first body and a second body according to a temperature of an air outlet, to prevent hot air from flowing back through the air duct. In this way, problems such as a rising surface temperature of a case portion and an excessively high system temperature inside the case caused by hot air backflow are alleviated according to an operating state of the electronic device.

DETAILED DESCRIPTION OF THE EMBODIMENTS

More detailed descriptions of specific embodiments of the disclosure are provided below with reference to the schematic diagrams. The advantages and features of the disclosure are described more clearly according to the following description and claims. It is to be noted that all of the accompanying drawings use very simplified forms and imprecise scales, which are only used for assisting in conveniently and clearly illustrating the objectives of the embodiments of the disclosure.

Figure 1A:
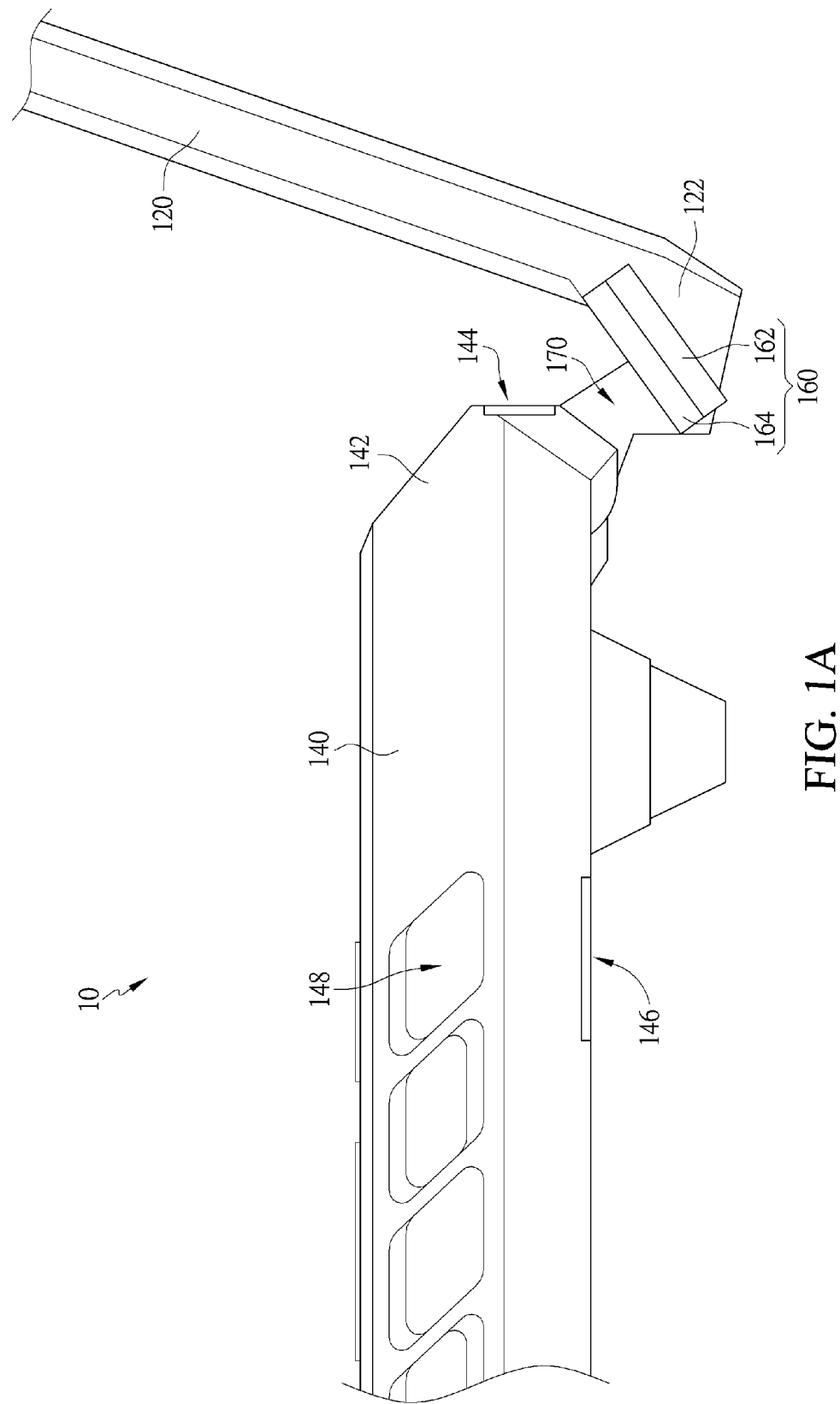
FIG. 1A and FIG. 1B are schematic side views of a first embodiment of an electronic device according to the disclosure.
Figure 1B:
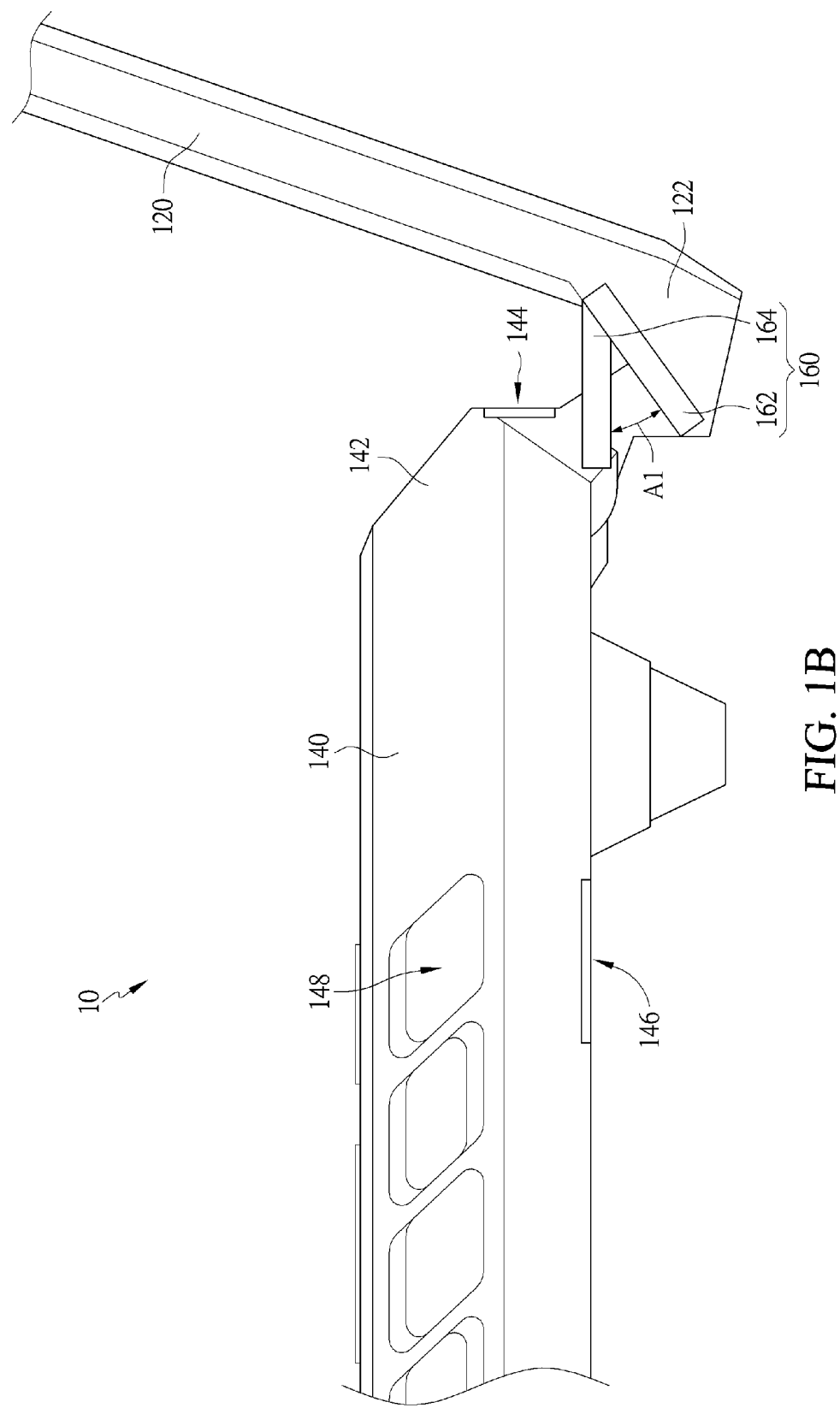

FIG. 1A and FIG. 1B are schematic side views of a first embodiment of an electronic device according to the disclosure. For ease of description, only a part of the electronic device related to the disclosure is shown in the figures. FIG. 1A shows the electronic device 10 in a low-load state. FIG. 1B shows the electronic device 10 in a high-load state.

The electronic device 10 includes a first body 120, a second body 140, and a baffle structure 160. The first body 120 includes a first edge 122. The second body 140 includes a second edge 142. The first edge 122 is pivotally connected to the second edge 142, and an air duct 170 is formed between the first edge 122 and the second edge 142.

In an embodiment, as shown in the figures, the first body 120 is a screen, and the second body 140 is a case. The second edge 142 of the second body 140, that is, an edge of the second body 140 close to a position at which the second body is pivotally connected to the first body 120 is provided with an air outlet 144. An air inlet 146 is provided on a bottom surface of the second body 140.

The baffle structure 160 is disposed in the air duct 170 and is located at a position corresponding to the air outlet 144 of the second body 140. In an embodiment, the baffle structure 160 is disposed on the first body 120 and is aligned with the air outlet 144.

To enable the baffle structure 160 to selectively close the air duct 170 according to a temperature of the air outlet 144, in this embodiment, the baffle structure 160 is made of a shape memory material (in an embodiment, titanium-nickel alloy), and a shape of the shape memory material changes with the temperature, so that the baffle structure 160 changes the shape thereof with temperature changes of the air outlet 144, so as to selectively close the air duct 170.

In an embodiment, as shown in the figures, the baffle structure 160 includes a first side 162 and a second side 164. The entire baffle structure 160 is made of the shape memory material. The first side 162 of the baffle structure 160 is fixed to the first body 120, and the second side 164 of the baffle structure 160 extends into the air duct 170. An angle A1 between the first side 162 and the second side 164 changes according to the temperature of the air outlet 144, so that the baffle structure 160 is converted between a low-temperature shape (which corresponds to FIG. 1A) and a high-temperature shape (which corresponds to FIG. 1B).

Referring to FIG. 1A, the temperature of the air outlet 144 is relatively low when the electronic device 10 is in the low-load state. In this case, the baffle structure 160 is in a low-temperature state, and the second side 164 is closely adjacent to the first side 162 of the baffle structure, to avoid affecting an opening action of the first body 120 relative to the second body 140 and keep the air duct 170 unimpeded.

Referring to FIG. 1B, when the electronic device 10 is in the high-load state, the temperature of the air outlet 144 rises, and consequently, a temperature of the baffle structure 160 exceeds a deformation temperature. In this case, the baffle structure 160 is converted from the original low-temperature shape to the high-temperature shape.

The second side 164 of the baffle structure 160 unfolds toward the air duct 170 and abuts against the second body 140 to close the air duct 170. The baffle structure 160 is V-shaped as a whole. In this way, hot air flowing out of the air outlet 144 of the second body 140 is prevented from flowing back into the air inlet 146 located on the bottom surface of the second body 140 or an air outlet 148 located on a side surface of the second body 140 through the air duct 170.

The deformation temperature is adjusted by changing material components. In an embodiment, the deformation temperature ranges from 40° C. to 45° C. In this way, the baffle structure 160 does not cover the air duct 170 when the electronic device 10 is in a normal low-load state or in a non-operating state, and the baffle structure 160 is deformed and covers the air duct 170 only when the electronic device 10 is in the high-load state.

In an embodiment, as shown in the figures, an opening direction of the baffle structure 160 is arranged along an airflow direction of the air duct 170, that is, a direction from an upper side of the second body 140 toward a lower side of the second body 140. In other embodiments, the opening direction of the baffle structure 160 is opposite to the airflow direction of the air duct 170.

In the embodiment of FIG. 1A and FIG. 1B mentioned above, the baffle structure 160 is fixed to the first body 120, and the air outlet 144 and the air inlet 146 are located on the second body 140. In other embodiments, the baffle structure 160 is fixed to the second body 140. In addition, in the embodiment of FIG. 1A and FIG. 1B mentioned above, the first body 120 is a screen, and the second body 140 is a case. In other embodiments, the first body 120 is changed to a case, and the air outlets 144 and 148 and the air inlet 146 are located on the first body 120.

Figure 2A:
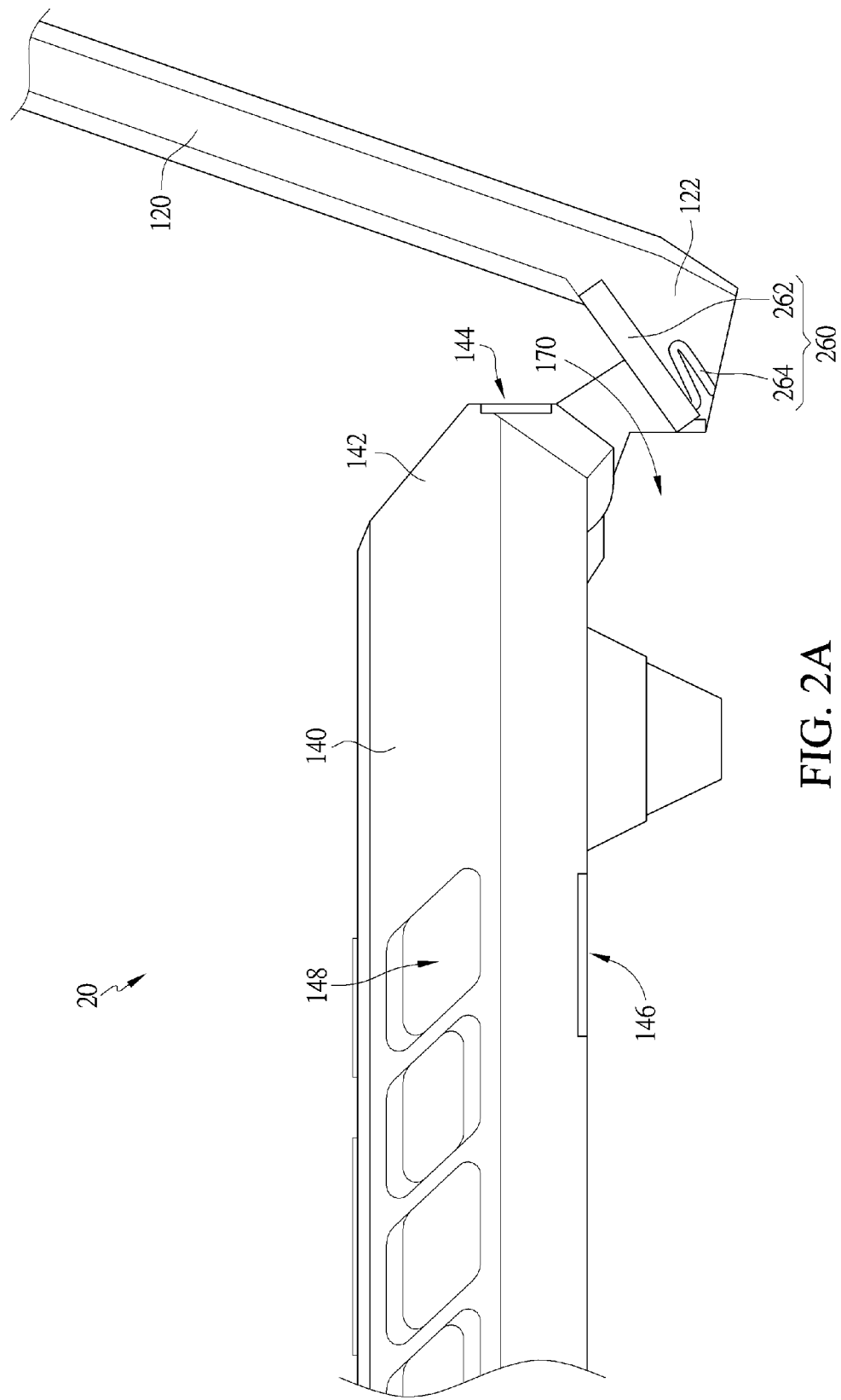
FIG. 2A and FIG. 2B are schematic side views of a second embodiment of an electronic device according to the disclosure.
Figure 2B:
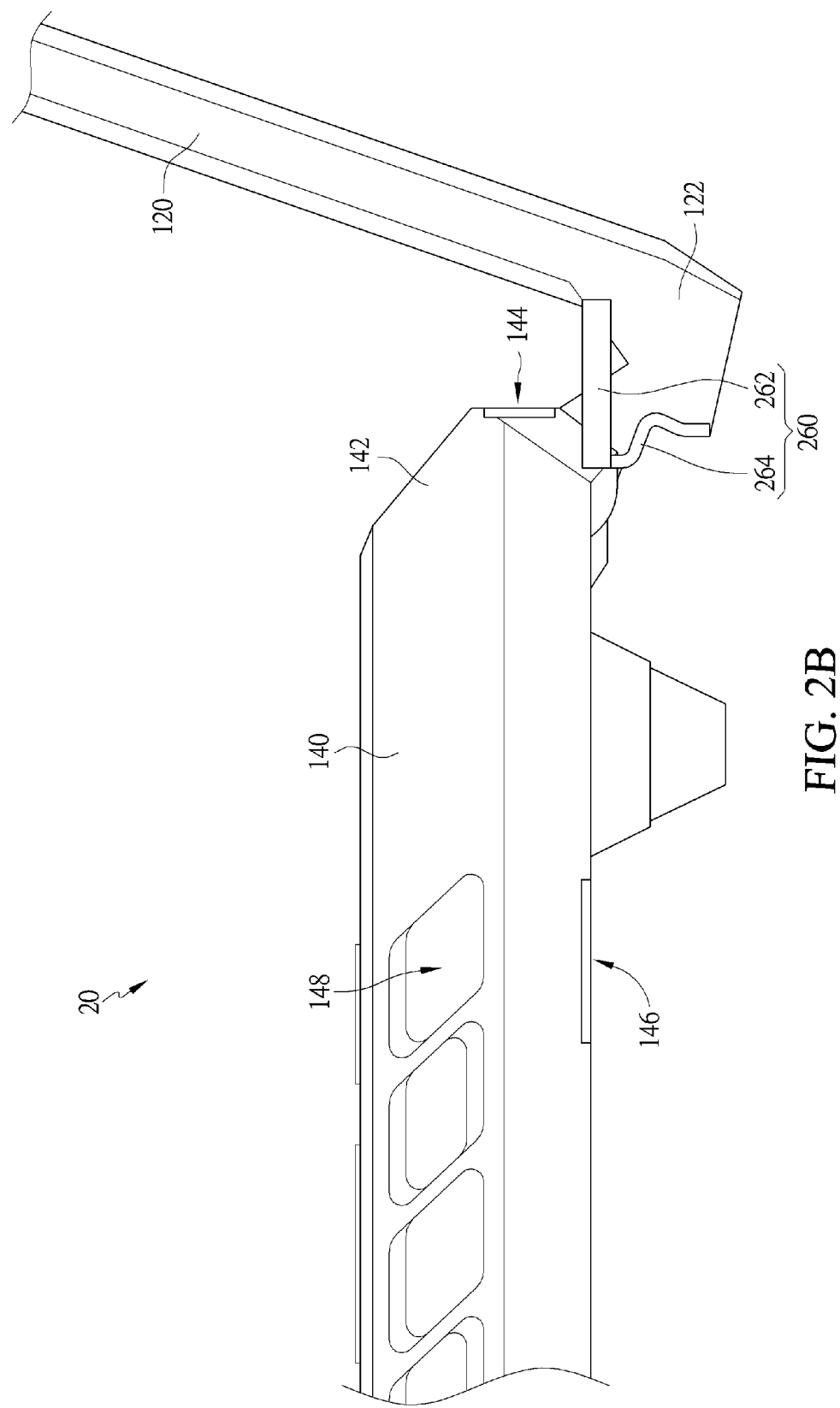

FIG. 2A and FIG. 2B are schematic side views of a second embodiment of an electronic device according to the disclosure. FIG. 2A shows the electronic device 20 in a low-load state. FIG. 2B shows the electronic device 20 in a high-load state.

Similar to the embodiment of FIG. 1A and FIG. 1B, in this embodiment, a shape of the shape memory material changes with the temperature, to enable baffle structures 160 and 260 to selectively close the air duct. However, different from the embodiment of FIG. 1A and FIG. 1B in which the entire baffle structure 160 is made of the shape memory material, in this embodiment, the baffle structure 260 includes a movable member 262 and an actuating member 264, and only the actuating member 264 is made of the shape memory material.

As shown in the figures, the movable member 262 is pivotally connected to the first body 120, the actuating member 264 is disposed between the movable member 262 and the first body 120, and two ends of the actuating member 264 are respectively connected to the movable member 262 and the first body 120.

The actuating member 264 is made of the shape memory material and is converted between a folded shape (which corresponds to FIG. 2A) and an unfolded shape (which corresponds to FIG. 2B) according to the temperature, to drive the movable member 262 to change a rotation angle of the movable member 262 relative to the first body 120.

Referring to FIG. 2A, the temperature of the air outlet 144 is relatively low when the electronic device 20 is in the low-load state. In this case, the baffle structure 260 is in a low-temperature state, and the actuating member 264 is in the folded shape, so that the movable member 262 is close to the first body 120, to avoid affecting an opening action of the first body 120 relative to the second body 140 and keep the air duct 170 unimpeded.

Referring to FIG. 2B, when the electronic device 20 is in the high-load state, the temperature of the air outlet 144 rises, and consequently, a temperature of the baffle structure 260 (in particular, the actuating member 264 in the baffle structure) exceeds a deformation temperature. In this case, the baffle structure 260 is converted from an original low-temperature shape to a high-temperature shape.

The actuating member 264 is converted from the original folded shape to the unfolded shape, to drive the movable member 262 to unfold toward the air duct 170 and abut against the second body 140 to close the air duct 170. In this way, hot air flowing out of the air outlet 144 is prevented from flowing back into the air inlet 146 located on the bottom surface of the second body 140 or an air outlet 148 located on a side surface of the second body 140 through the air duct 170.

In this embodiment, the actuating member 264 is substantially V-shaped and is converted between the folded shape and the unfolded shape to drive the movable member 262, so that the baffle structure 260 selectively closes the air duct 170. In other embodiments, the actuating member 264 is in a spiral shape or in another shape easy to change obviously in length.

In the electronic device provided in the disclosure, a baffle structure selectively closes an air duct disposed between a first body and a second body according to a temperature of an air outlet, to prevent hot air from flowing back through the air duct. In this way, problems such as a rising surface temperature of a case portion and an excessively high system temperature inside the case caused by hot air backflow are alleviated according to an operating state of the electronic device.

Although the disclosure is described with reference to the above embodiments, the embodiments are not intended to limit the disclosure. Any person skilled in the art may make modifications and improvements without departing from the spirit and scope of the disclosure. Therefore, the protection scope of the disclosure is subject to the claims.

What is claimed is:

1. An electronic device, comprising: a first body, comprising a first edge; a second body, comprising a second edge, wherein the first edge is pivotally connected to the second edge, an air outlet is provided on the second edge, and an air duct is formed between the first edge and the second edge; and a baffle structure made of a shape memory material, disposed in the air duct and located at a position corresponding to the air outlet, wherein the baffle structure selectively closes the air duct according to a temperature of the air outlet.

2. The electronic device according to claim 1, wherein the baffle structure comprises a first side and a second side, the first side is fixed to the first body, the second side extends into the air duct, and an angle between the first side and the second side changes according to the temperature of the air outlet.

3. The electronic device according to claim 1, wherein the baffle structure is V-shaped.

4. The electronic device according to claim 1, wherein the baffle structure comprises an actuating member and a movable member, the movable member is pivotally connected to the first body, the actuating member is disposed between the movable member and the first body, and the actuating member is made of a shape memory material, to drive the movable member to selectively close the air duct.

5. The electronic device according to claim 4, wherein the actuating member is converted between a folded shape and an unfolded shape according to the temperature of the air outlet.

6. The electronic device according to claim 4, wherein the actuating member is V-shaped.

7. The electronic device according to claim 4, wherein the actuating member is in a spiral shape.

\* \* \* \* \*